(12) United States Patent
Sugiyama et al.

(10) Patent No.: US 10,957,652 B2
(45) Date of Patent: Mar. 23, 2021

(54) CIRCUIT BOARD

(71) Applicant: TAIYO YUDEN CO., LTD., Tokyo (JP)

(72) Inventors: Yuichi Sugiyama, Tokyo (JP); Masashi Miyazaki, Tokyo (JP); Yoshiki Hamada, Tokyo (JP)

(73) Assignee: TAIYO YUDENCO., LTD., Tokyo (JP)

( * ) Notice: Subject to any disclaimer, the term of this patent is extended or adjusted under 35 U.S.C. 154(b) by 0 days.

(21) Appl. No.: 16/790,625

(22) Filed: Feb. 13, 2020

(65) Prior Publication Data

US 2020/0185332 A1    Jun. 11, 2020

Related U.S. Application Data

(62) Division of application No. 16/057,655, filed on Aug. 7, 2018, now Pat. No. 10,607,940.

(30) Foreign Application Priority Data

Aug. 8, 2017 (JP) .............................. JP2017-153327

(51) Int. Cl.
*H01L 23/538* (2006.01)
*H01L 21/48* (2006.01)
(Continued)

(52) U.S. Cl.
CPC ........ *H01L 23/5389* (2013.01); *H01L 21/486* (2013.01); *H01L 21/4857* (2013.01);
(Continued)

(58) Field of Classification Search
CPC ... H01L 23/5389; H01L 21/486; H01L 23/13; H01L 23/3121; H01L 23/3142;
(Continued)

(56) References Cited

U.S. PATENT DOCUMENTS 5,020,637 A    6/1991 Hoenselaar et al.
7,116,557 B1    10/2006 Raby et al.
(Continued)

FOREIGN PATENT DOCUMENTS

CN    100345466 C    10/2007
JP    2005-311249 A    11/2005
(Continued)

OTHER PUBLICATIONS

Taiwanese Office Action dated Jul. 5, 2019, in a counterpart Taiwanese patent application No. 107121095. (Cited in the Parent U.S. Appl. No. 16/057,655.).

*Primary Examiner* — Thinh T Nguyen
(74) *Attorney, Agent, or Firm* — Chen Yoshimura LLP

(57) ABSTRACT

A circuit board includes a core layer including a plurality of metal layers laminated one over another, a bottommost metal layer of the plurality of metal layers being thickest, and a topmost metal layer of the plurality of metal layer being thinnest; an upper insulating layer and an upper conductive pattern provided over a top surface of the core layer; and a lower insulating layer and a lower conductive pattern provided below a bottom surface of the core layer, wherein the topmost metal layer of the core metal layer is patterned to have a prescribed shaped section that serves as wiring and that is connected to the upper conductive pattern, wherein a metal ratio that is defined as a ratio of an area that is formed of metal relative to an entire area in a plan view is higher in the bottommost metal layer than in the topmost metal layer.

3 Claims, 16 Drawing Sheets

(51) Int. Cl.
   *H01L 23/13*        (2006.01)
   *H01L 23/31*        (2006.01)
   *H01L 25/16*        (2006.01)
   *H01L 23/34*        (2006.01)

(52) U.S. Cl.
   CPC .......... *H01L 23/13* (2013.01); *H01L 23/3121* (2013.01); *H01L 23/3142* (2013.01); *H01L 23/5383* (2013.01); *H01L 23/5384* (2013.01); *H01L 23/5386* (2013.01); *H01L 25/16* (2013.01); *H01L 23/34* (2013.01); *H01L 2224/18* (2013.01)

(58) Field of Classification Search
   CPC . H01L 23/5383; H01L 23/5386; H01L 25/16; H01L 21/4857
   USPC ........ 257/741, 753, 758; 438/650, 118, 622, 438/686
   See application file for complete search history.

(56) References Cited

U.S. PATENT DOCUMENTS

| | | |
|---|---|---|
| 2004/0070948 A1 | 4/2004 | Kao et al. |
| 2005/0230835 A1 | 10/2005 | Sunohara et al. |
| 2005/0255303 A1 | 11/2005 | Sawatari et al. |
| 2006/0191711 A1* | 8/2006 | Cho et al. ........... H01L 23/5389 257/698 |

FOREIGN PATENT DOCUMENTS

| | | |
|---|---|---|
| TW | 436997 B | 5/2001 |
| TW | I220782 B | 9/2004 |
| WO | 2009/099065 A1 | 8/2009 |

\* cited by examiner

CIRCUIT BOARD

BACKGROUND OF THE INVENTION

Technical Field

The present invention relates to a semiconductor module.

Background Art

A semiconductor module with a multi-layer structure is well-known, for example (Patent Document 1, for example).

RELATED ART DOCUMENTS

Patent Document

Patent Document 1: Japanese Patent Application Laid-Open Publication No. 2005-311249

SUMMARY OF THE INVENTION

A semiconductor module according to Patent Document 1 has a metal core in which a first metal plate and a second metal plate are bonded together. In the semiconductor module, a counterbore of a housing unit formed by removing a portion of the metal core does not have a flat surface.

In such a semiconductor module, an electronic component is placed in the counterbore of the housing unit and is sealed using an insulating layer. At such time, since the counterbore does not have a flat surface, there is concern that may cause a phenomenon, so-called "bleed-out phenomenon," in which, after the housing unit is sealed using the insulating layer in the semiconductor module, an insulating resin of the insulating layer climbs side faces at a periphery of the counterbore due to capillary action. As a result, there was concern that a flowout of the insulating layer that would cause the electronic component to move may be generated and that the stress on the semiconductor module would become unbalanced, leading to a decrease in the quality of the semiconductor module. Accordingly, the present invention is directed to a scheme that substantially obviates one or more of the problems due to limitations and disadvantages of the related art.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a circuit board, including: a core layer including a plurality of metal layers laminated one over another, a bottommost metal layer of the plurality of metal layers being thickest among the plurality of metal layers, and a topmost metal layer of the plurality of metal layer being thinnest among the plurality of metal layers; an upper insulating layer and an upper conductive pattern provided over a top surface of the core layer; and a lower insulating layer and a lower conductive pattern provided below a bottom surface of the core layer, wherein the topmost metal layer of the core metal layer is patterned to have a prescribed shaped section that serves as wiring and that is connected to the upper conductive pattern, wherein a metal ratio that is defined as a ratio of an area that is formed of metal relative to an entire area in a plan view is higher in the bottommost metal layer than in the topmost metal layer.

Additionally, the problems that are disclosed in the present application and solution for solving the problems will be clarified using the description in the Detailed Description of Embodiments section, the description of the drawings, and the like.

According to the present invention, it is possible to prevent a so-called "bleed-out phenomenon" of an insulating resin in a semiconductor module.

It is to be understood that both the foregoing general description and the following detailed description are exemplary and explanatory, and are intended to provide further explanation of the invention as claimed.

DETAILED DESCRIPTION OF EMBODIMENTS

Figure 1:
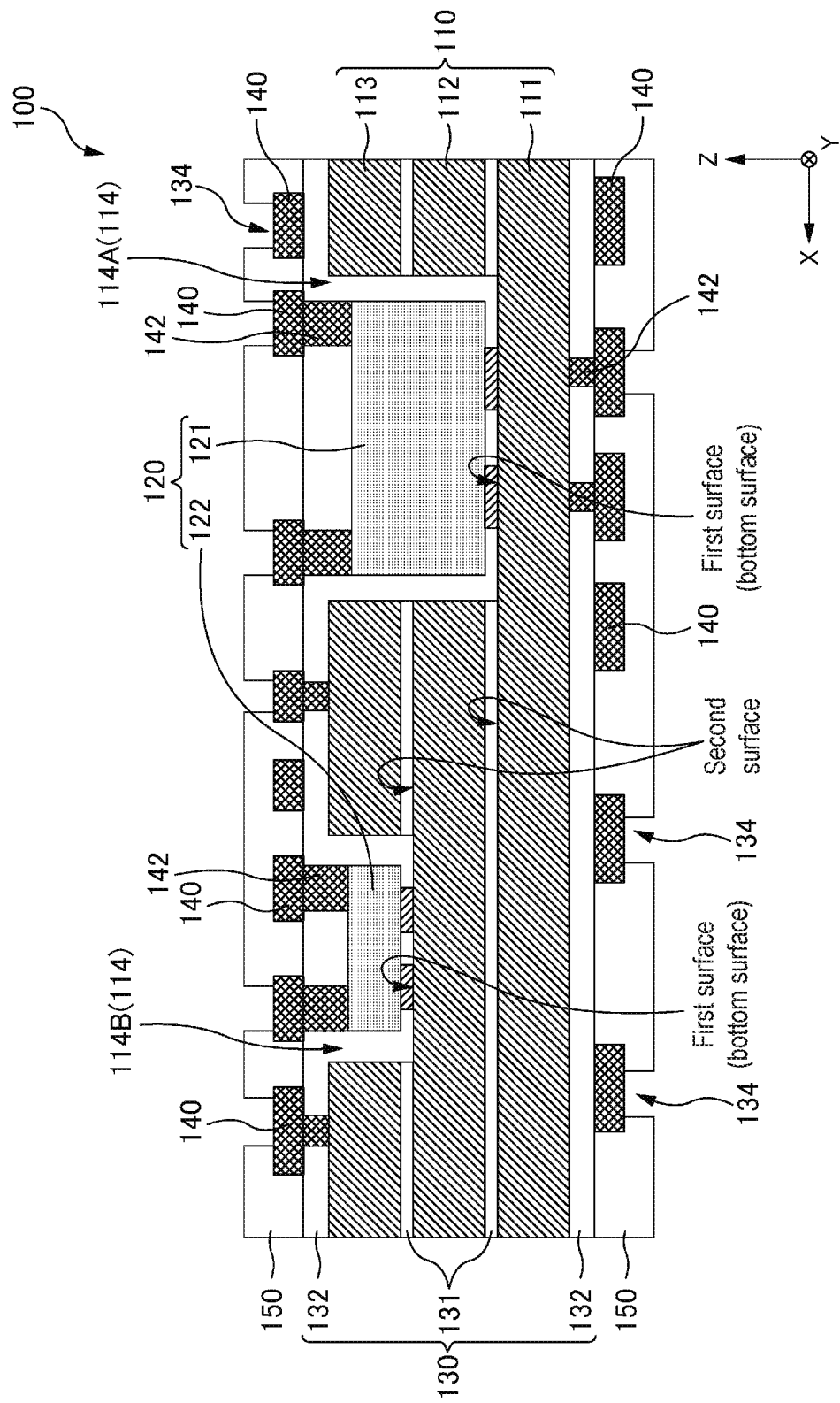
FIG. 1 is a cross-sectional view that schematically shows an example of a semiconductor module according to Embodiment 1.

In the description below, constituting components that are common or similar in the drawings are assigned the same or similar reference characters.

Semiconductor Module 100 According to Embodiment 1

Figure 2:
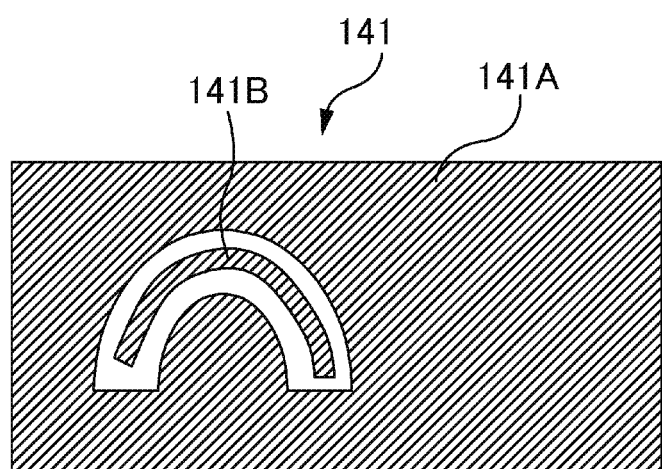
FIG. 2 is a plan view that schematically shows an example of an island-shaped conductive pattern in the semiconductor module according to Embodiment 1.
Figure 3:
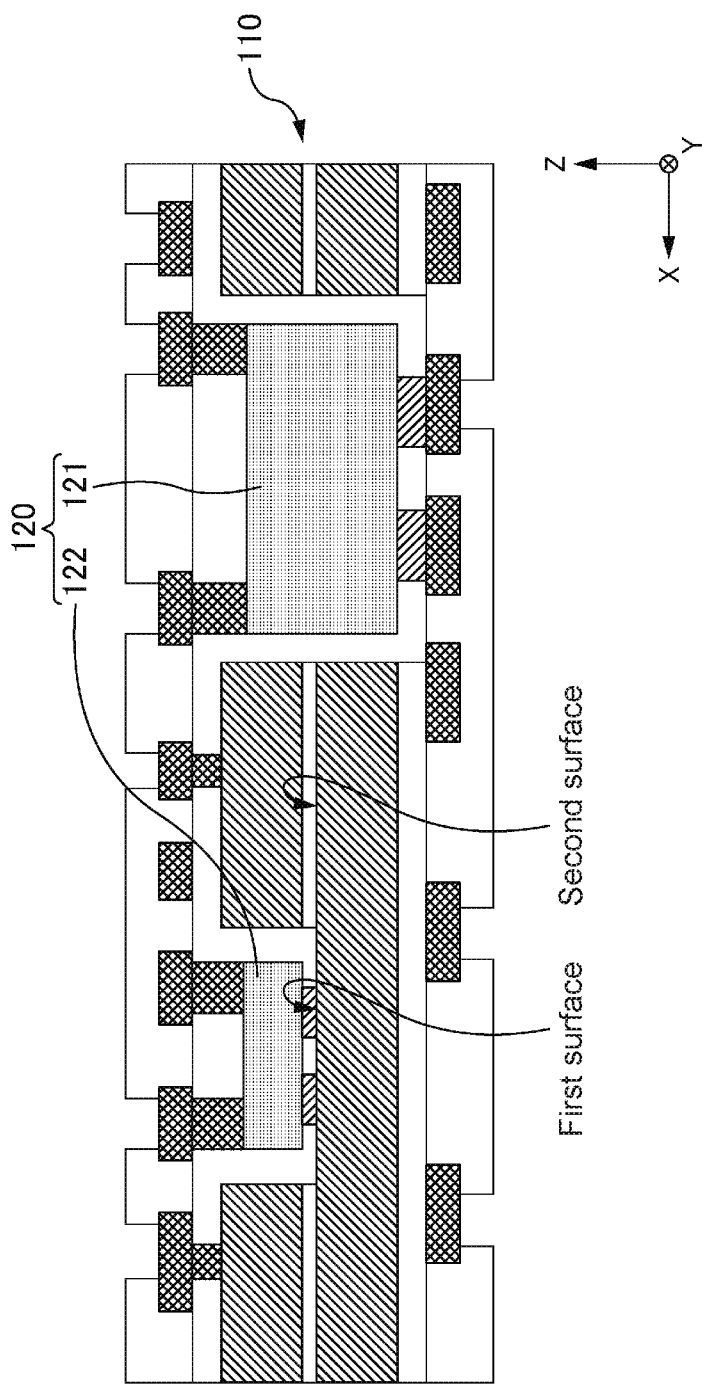
FIG. 3 is a cross-sectional view that schematically shows an example of another form of the semiconductor module according to Embodiment 1.
Figure 6:
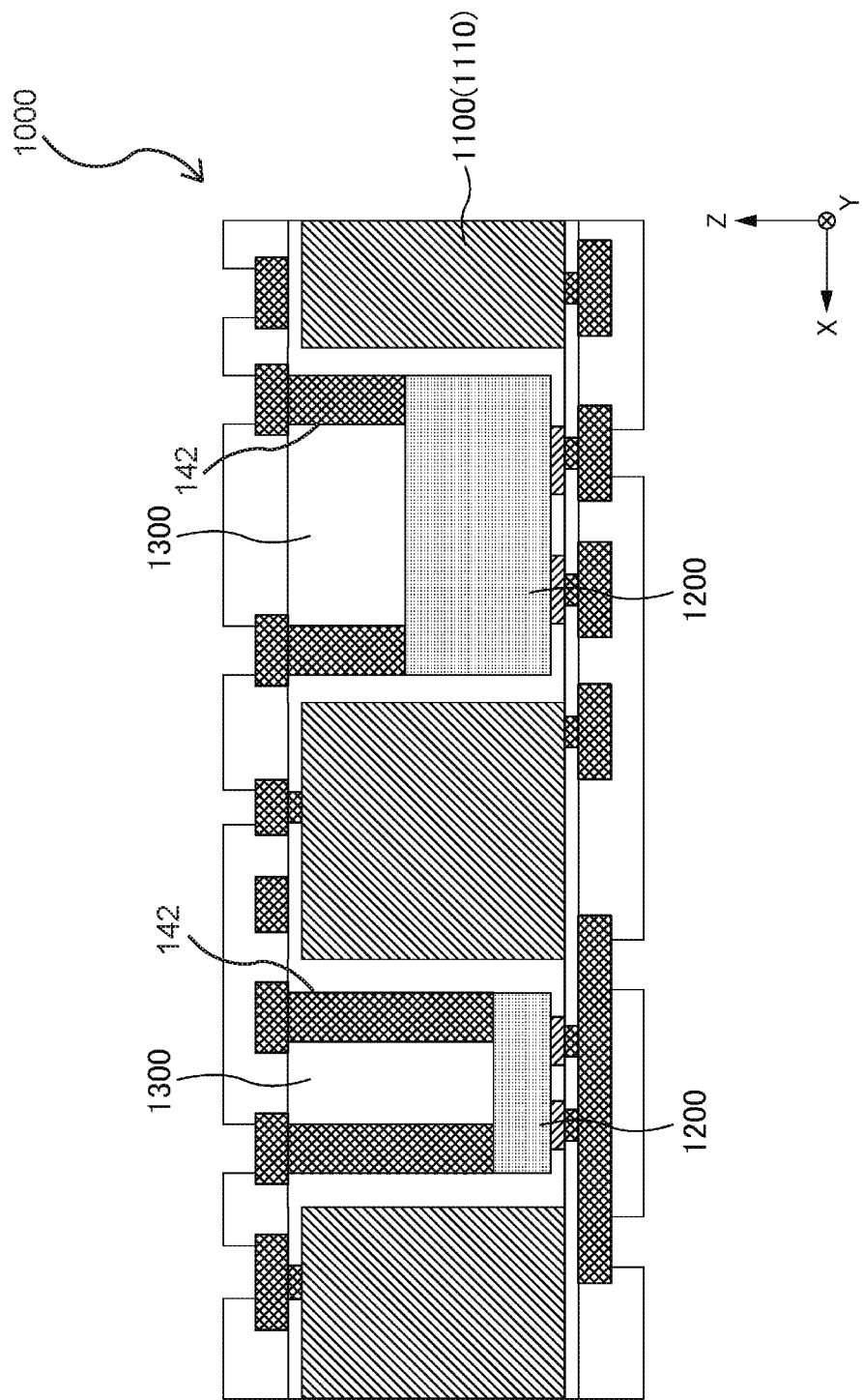
FIG. 6 is a cross-sectional view that schematically shows an example of a generic semiconductor module.

A semiconductor module 100 of Embodiment 1 will be described while referencing FIGS. 1, 2, 3, 4A to 4K, and 6. FIG. 1 is a cross-sectional view that schematically shows an example of the semiconductor module 100 according to Embodiment 1. FIG. 2 is a plan view that schematically shows an example of an island-shaped conductive pattern 141 in the semiconductor module 100 according to Embodiment 1. FIG. 3 is a cross-sectional view that schematically shows an example of another form of the semiconductor module 100 according to Embodiment 1. FIGS. 4A to 4K are cross-sectional views that show a manufacturing process of the semiconductor module 100 according to Embodiment 1. FIG. 6 is a cross-sectional view that schematically shows an example of a generic semiconductor module 1000.

Here, in FIGS. 1, 2, 3, and 4A to 4K, a thickness direction of the semiconductor module 100 is defined as a Z direction, a direction moving from the front toward the back of the paper surface in a plan view orthogonal to the Z axis is set as a Y direction, and a direction orthogonal to the Y axis and the Z axis is set as an X direction. In addition, in each of the directions, a "+" reference character is added in the positive direction and a "−" reference character is added in the negative direction.

The semiconductor module 100 according to Embodiment 1 is a module that is able to suppress the bleed-out phenomenon of insulating resins. Furthermore, in the semiconductor module 100, it is possible to efficiently dissipate heat generated by internal electronic components 120, and it is also possible to efficiently house internal electronic components 120 of differing sizes. Furthermore, a circuit board having the semiconductor module 100 increases the metal ratio of a bottommost metal layer, and increases the rigidity of the circuit board itself. Here, the metal ratio for each metal layer refers to the ratio of the area of a metal portion of the metal layer relative to the entire area of the metal layer in the XY plane in, for example, the semiconductor module 100.

<<Configuration of the Semiconductor Module 100>>

As shown in FIG. 1, such a semiconductor module 100 is configured to at least include: a metal core layer 110; the internal electronic components 120; insulating layers 130; the conductive pattern 140; and solder resist layers 150. Note that the conductive pattern 140 mentioned here is an electrode, wiring integrated with an electrode, an electrode that contacts a via, an external electrode, or the like.

The metal core layer 110 has a plate or sheet shape in which a first metal layer 111, a second metal layer 112, and a third metal layer 113 are stacked with the insulating layers 130 described below therebetween, for example. Surfaces of the first metal layer 111, second metal layer 112, and third metal layer 113 undergo surface roughening so as to have surface irregularities. Thus, it is possible to improve adhesion with the insulating layers 130 described below. Since the surface or rear surface of the first metal layer 111, second metal layer 112, or third metal layer 113 is copper plated to form a plated film which has a multicrystalline structure, minute surface irregularities are formed when the plated film is etched.

The metal core layer 110 imparts rigidity to the semiconductor module 100. In addition, the metal core layer 110 is used as a ground or a ground electrode, for example. The thickness of the metal core layer 110 is less than or equal to 250 μm, for example, and is preferably 210 μm, 160 μm, or 120 μm. Cavities 114 for placing the internal electronic components 120 are formed in the metal core layer 110. As shown in FIG. 1, the cavities 114 of the present embodiment are formed in: the third metal layer 113 in which an active electronic component is housed; and the third metal layer 113 and the second metal layer 112 in which a passive electronic component or a power system active electronic component thicker than the active electronic component (a second electronic component 122 described later) is housed, for example. The cavities 114 are sealed using an insulating resin.

Compared to the second metal layer 112 and the third metal layer 113 (hereafter also referred to as the "upper metal layer 112" and "upper metal layer 113"), the first metal layer 111 (hereafter also referred to as the "lower metal layer 111") imparts a larger amount of rigidity to the semiconductor module 100. The first metal layer 111 increases the rigidity of the semiconductor module 100 by being thicker than the other metal layers, using a material with a higher rigidity than the materials of the other metal layers, or by having a larger metal ratio than the other metal layers.

In other words, the first metal layer 111 is formed using a harder metal material compared to the second metal layer 112 and the third metal layer 113. More specifically, it is preferable that the first metal layer 111 be formed using a rolled copper alloy, and the second metal layer 112 and the third metal layer 113 be formed using rolled copper or electrolytic copper.

A first surface (also referred to as a "bottom surface" of the cavities 114) of the first metal layer 111 that is exposed when the cavities 114 are formed is surface-treated using etching and laser processing so as to be a surface smoother than a second surface of the first metal layer 111 that is different from the first surface and has undergone surface roughening. As a result, it is possible to prevent an underfill (fixing material) and insulating resin applied to the first surface from moving on the first surface via capillary action and to prevent these materials from transferring onto side faces surrounding the first surface. In other words, since it is possible to suppress movement of the internal electronic components 120 associated with the underfill and insulating resin that move via capillary action, it is possible to prevent imbalances in the stress on the semiconductor module 100 and to improve the quality of the semiconductor module 100. Here, the underfill (not shown) is a material that penetrates between the internal electronic components 120 and the metal layers via capillary action and strengthens the bond between the internal electronic components 120 and the metal layers by being cured via heating.

Since the metal core layer 110 is formed by stacking a plurality of thin metal layers, as shown in FIG. 2, it is possible to form a fine conductive pattern 141 in the third metal layer 113 disposed on the surface of the metal core layer 110. The fine conductive pattern 141 is configured so as to include: a first metal section 141A; and a second metal section 141B isolated from the first metal section 141A. The first metal section 141A is connected to the conductive pattern 140, for example, and the second metal section 141B is connected to a ground, for example. For example, if the third metal layer 113 were thick, when the conductive pattern 141 is formed in the third metal layer 113 using wet etching, the etching (so-called "side etching") would extend in the horizontal directions (X direction, Y direction) along with the etching occurring in the thickness direction (Z direction). In contrast, in a thin third metal layer 113 such as in the present embodiment, it is possible to reduce the amount of the side etching; thus, it is possible to form the fine conductive pattern 141. As a result, it is possible in the semiconductor module 100 to mount a high performance multi-pin package having 100 or more pins. Note that since the front and rear surfaces of the third metal layer 113 and the surface of the second metal layer 112 have undergone surface roughening, the fine conductive pattern 141 will not easily detach from the insulating layers 130.

The internal electronic components 120 are components that, as mentioned above, have a prescribed Z direction thickness (hereafter referred to as a "thickness"), and are housed inside the metal core layer 110 that is formed of a plurality of metal layers. As shown in FIG. 1, the internal electronic components 120 are a passive element (hereafter referred to as a "first electronic component 121") such as a filter element, resistor, coil, or capacitor, and an active element (hereafter referred to as the "second electronic component 122") having a diode and transistor. These internal electronic components 120 are placed in the cavities 114 provided in the metal core layer 110, and are electrically connected to the metal core layer 110 as needed. Furthermore, these components 120 are electrically connected to the conductive pattern 140 through the via 142.

In addition, as shown in FIG. 6, a metal core layer 1100 is usually formed using one metal layer; thus, the metal layer is significantly removed when internal electronic components 1200 having a thin thickness are placed inside the metal core layer 1100, for example. In other words, the volume of the metal material of the metal core layer 1100 is relatively small compared to the volume of an insulating body that fills a cavity 1300 in the metal core layer 1100. Therefore, since deformation from external forces is more likely to occur in the insulating body than in the metal material, there is concern that the semiconductor module 1000 would deform at a small amount of external force.

In regards to this issue, the metal core layer 110 is formed using a plurality of metal layers in the semiconductor module 100 according to Embodiment 1; thus, as shown in FIG. 1, the second electronic component 122 is efficiently housed within the thickness range of the third metal layer 113, and the first electronic component 121 is efficiently housed within a thickness range in which the thickness of the second metal layer 112 and the thickness of the third metal layer 113 are added together. In other words, each of the internal electronic components 120 can be optimally housed in accordance with the respective sizes of the small internal electronic component 120 and the large internal electronic component 120. Accordingly, it is possible to make the volume of the metal material of the metal core layer 110 relatively large; thus, deformation due to external forces can be suppressed even more than before.

In addition, the first metal layer 111 has a smaller number of cavities or number of holes (simple holes, through-holes, or the like) than the second and third metal layers 112, 113; thus, rigidity of the module increases. Here, three layers are shown in the figures; it is possible in a plurality of two or more metal layers to increase the rigidity of an entire semiconductor module substrate by reducing hole formation, decreasing the number of or eliminating cavities, reducing slit formation, and the like in the lower and bottommost metal layers. Here, the hole formation improves adhesion between the insulating layers and the first to third metal layers 111 to 113, and refers to forming cylindrically-shaped holes. The slit refers to a hole formed by planarly elongating the above-mentioned hole, for example. When forming an island-shaped electrode, the slit refers to a ring-shaped portion formed by grinding an area around the periphery of the electrode.

Furthermore, as illustrated in FIG. 6, when the internal electronic components 1200 are electronic components that emit a large amount of heat, there is concern that heat would build up in the semiconductor module 1000 since the extent to which the internal electronic components 1200 can dissipate heat is small. In regards to this issue, it is possible in the semiconductor module 100 according to Embodiment 1 to efficiently dissipate the heat of the internal electronic components 120 via the second metal layer 112 that is connected to the internal electronic components 120.

In addition, as shown in FIG. 6, it was necessary to elongate the via 142 connected to the internal electronic components 1200. In regards to this issue, as shown in FIG. 1, it is possible in the semiconductor module 100 according to Embodiment 1 to set contact surfaces for the vias 142 to an identical height even if the internal electronic components 120 have different thicknesses. As a result, it is possible to decrease the size of the via 142; thus, high-density wiring is possible in the metal core layer 110.

Returning to FIG. 1, the insulating layers 130 are formed of an epoxy resin, a polyimide or bismaleimide triazine resin, and the like, for example. Glass fibers are provided within these resins. In addition, these resins may contain a filler such as aluminum oxide or silica dioxide in place of the glass fibers. Furthermore, both the glass fibers and the filler may be mixed together. These resins are so-called thermosetting synthetic resins.

The insulating layers 130 include, for example: first insulating layers 131 provided between each of the first metal layer 111, second metal layer 112, and third metal layer 113 in the metal core layer 110; and second insulating layers 132 for sealing the surfaces of the metal core layer 110 and the cavities 114. Here, it is preferable that the first insulating layers 131 have better thermal conductivity than the second insulating layers 132. As mentioned above, this configuration is for efficiently dissipating the heat of the internal electronic components 120 that generate a large amount of heat. In addition, it is preferable that the thickness of the first insulating layers 131 be thinner than the thickness of the second insulating layers 132. This configuration is for improving the heat dissipation effect while keeping the metal core layer 110 thin.

The conductive pattern 140 is formed on the second insulating layers 132, and is insulation-treated. It is preferable that the material of the conductive pattern 140 be the same as the material of the first to third metal layers 111 to 113 or be a material with mechanical properties similar to the material of the first to third metal layers 111 to 113, such as copper. Note that, as shown in FIG. 1, the conductive pattern 140 is shown as being configured of one layer; however, the number of layers included in the conductive pattern 140 may be appropriately modified.

The solder resist layers 150 are insulating films that protect circuit patterns formed in the semiconductor module 100, and are formed on the surfaces of the insulating layers 130. The solder resist layers 150 are formed of a thermosetting epoxy resin, for example.

Note that an external electronic component 160 is provided on a surface of the above-mentioned semiconductor module 100. The external electronic component 160 is an integrated circuit or imaging element, for example, and is electrically connected to the internal electronic components 120 and the metal layers by the vias 142.

Figure 5:
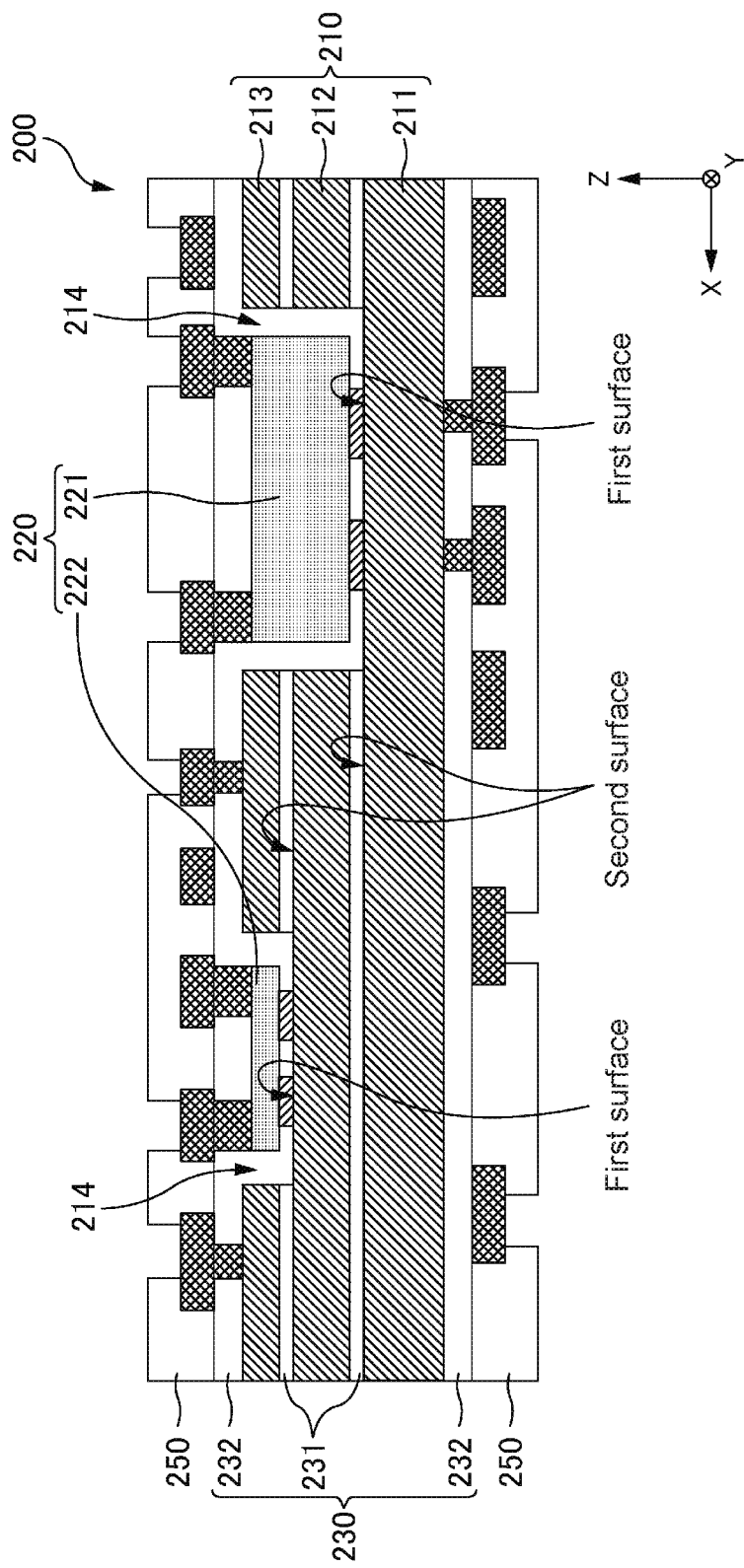
FIG. 5 is a cross-sectional view that schematically shows a semiconductor module according to Embodiment 2.

In the above description, the semiconductor module 100 was described as having a metal core layer 110 that included three metal layers; however, the present invention is not limited to this. For example, the semiconductor module 100 may have a metal core layer 110 that includes two metal layers such as those shown in FIG. 3. Furthermore, the semiconductor module 100 may have a metal core layer 110 that includes four or more metal layers. In other words, the semiconductor module 100 have a metal core layer 110 having a plurality of metal layers, and the surfaces of the metal layers on which the internal electronic components 120 are placed are surface-treated so as to become smooth surfaces. In FIG. 3, the metal layers 110 are drawn at the same thickness; however, as will be described in detail later, it is possible, as shown in FIG. 5, to make the upper metal layer 110 into a fine pattern by thinning the upper layers and thickening the bottom layers. In other words, the fine pattern processing described using FIG. 2 is possible.

<<Manufacturing Process of the Semiconductor Module 100>>

The manufacturing process of the semiconductor module 100 will be described below with reference to FIGS. 4A to 4K. Note that the description below assumes that the semiconductor module 100 according to Embodiment 1 is being manufactured, and overlapping descriptions and reference characters in the drawings will be appropriately omitted.

Figure 4A:
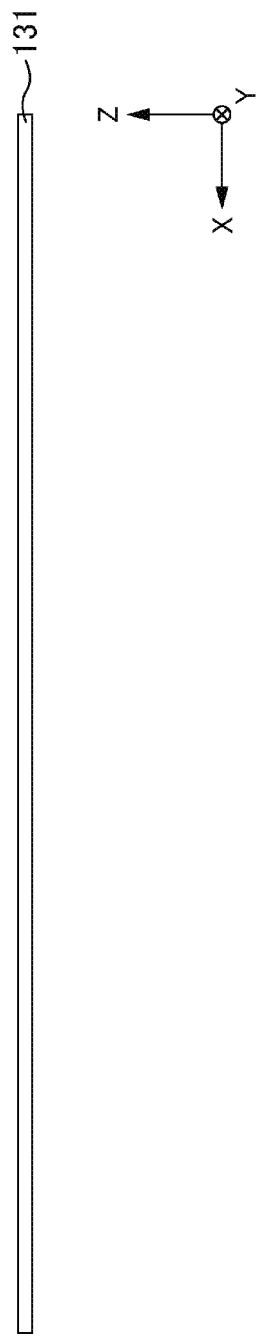
FIG. 4A is a cross-sectional view showing a step of preparing a first insulating layer during a manufacturing process of the semiconductor module according to Embodiment 1.
Figure 4B:
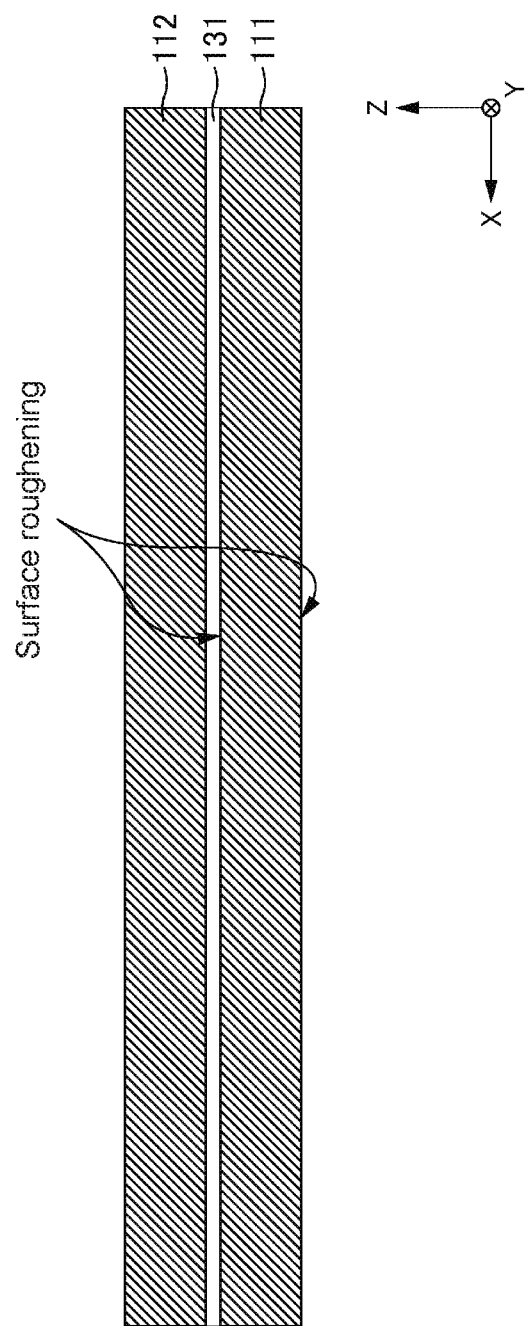
FIG. 4B is a cross-sectional view showing a step of forming a first metal layer and a second metal layer on a surface of the first insulating layer during the manufacturing process of the semiconductor module according to Embodiment 1.

First, as shown in FIGS. 4A and 4B, the first metal layer 111 and the second metal layer 112 are press-bonded with a first insulating layer 131 therebetween. The step of bonding the first metal layer 111 and the second metal layer 112 may involve laminating. The surfaces of the first metal layer 111 and the second metal layer 112 undergo surface roughening so as to have surface irregularities. Thus, it is possible to increase the adhesion strength between the first insulating layer 131 and the first metal layer 111 and second metal layer 112.

Figure 4C:
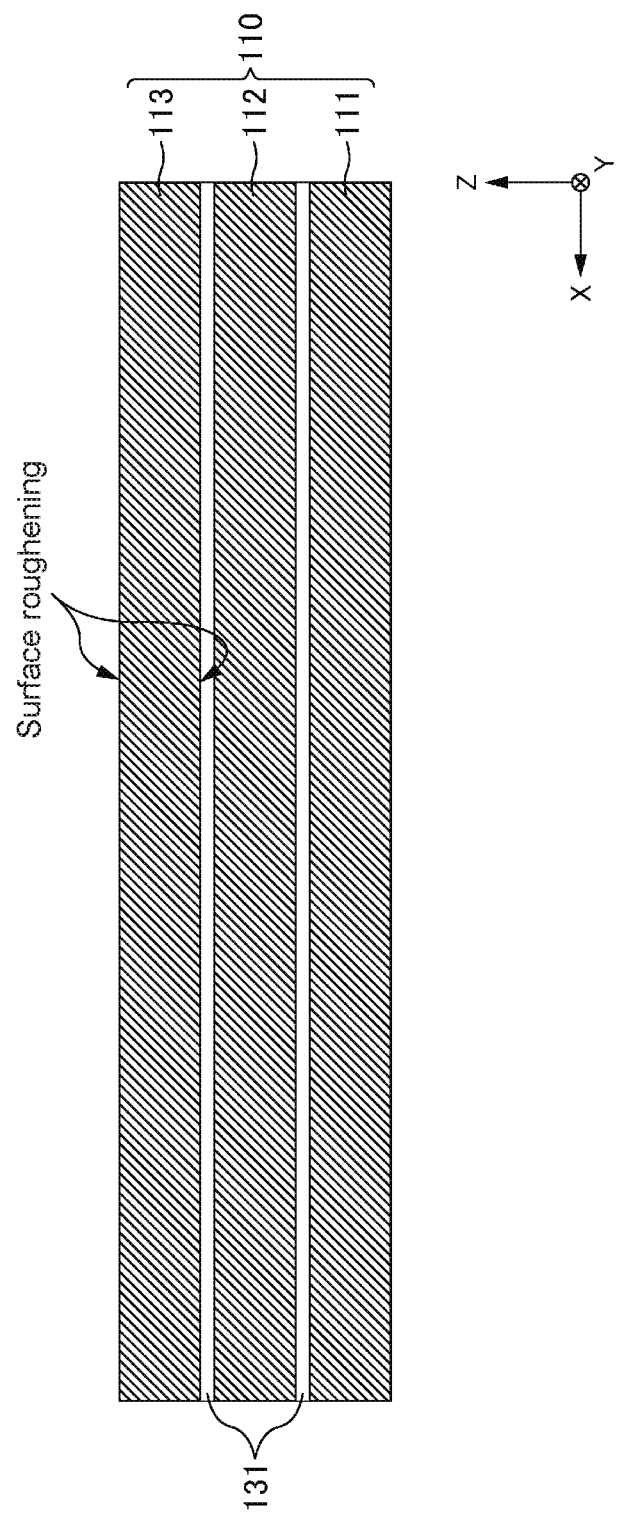
FIG. 4C is a cross-sectional view showing a step of forming a third metal layer during the manufacturing process of the semiconductor module according to Embodiment 1.

Furthermore, as shown in FIG. 4C, the third metal layer 113 is press-bonded to the second metal layer 112 with a first insulating layer 131 provided on the surface of the second metal layer 112 therebetween. Thus, it is possible to manufacture a metal core substrate formed of three metal layers. Note that the surface of the third metal layer 113 undergoes surface roughening similar to that for the first metal layer 111 and the second metal layer 112. The first to third metal layers 111 to 113 each having an insulating layer 130 may be caused to simultaneously undergo thermal pressure bonding. Each of the first to third metal layers 111 to 113 may be a rolled copper having a plated film thereon. The plated films are of fine polycrystals grown in the Z direction; thus, when the films are lightly etched, the grain boundary of the crystals is etched, and roughening is easy.

Figure 4D:
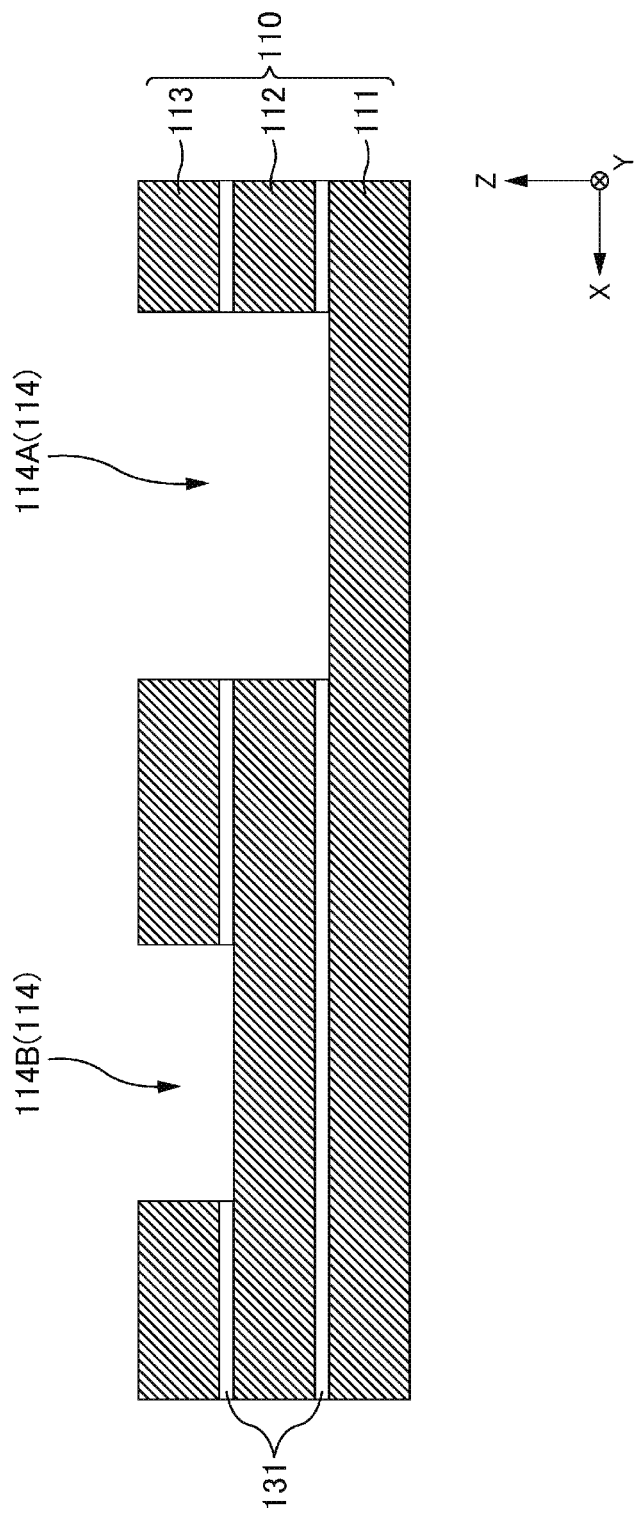
FIG. 4D is a cross-sectional view showing a step of forming cavities during the manufacturing process of the semiconductor module according to Embodiment 1.

Next, as shown in FIG. 4D, the first insulating layers 131, the second metal layer 112, and the third metal layer 113 are removed via laser processing, etching, or mechanical processing, creating the cavities 114 for providing the internal electronic components 120. During the present manufacturing process, a first cavity 114A and a second cavity 114B are created, for example. At such time, surfaces of bottom surfaces of the first cavity 114A and the second cavity 114B have surface irregularities as mentioned above. This is because the insulating layer 131 is exposed by etching the second metal layer 112 or third metal layer 113, and when this insulating layer 131 is removed using a laser, a surface of the first metal layer 111 or second metal layer 112 is exposed as is.

Figure 4E:
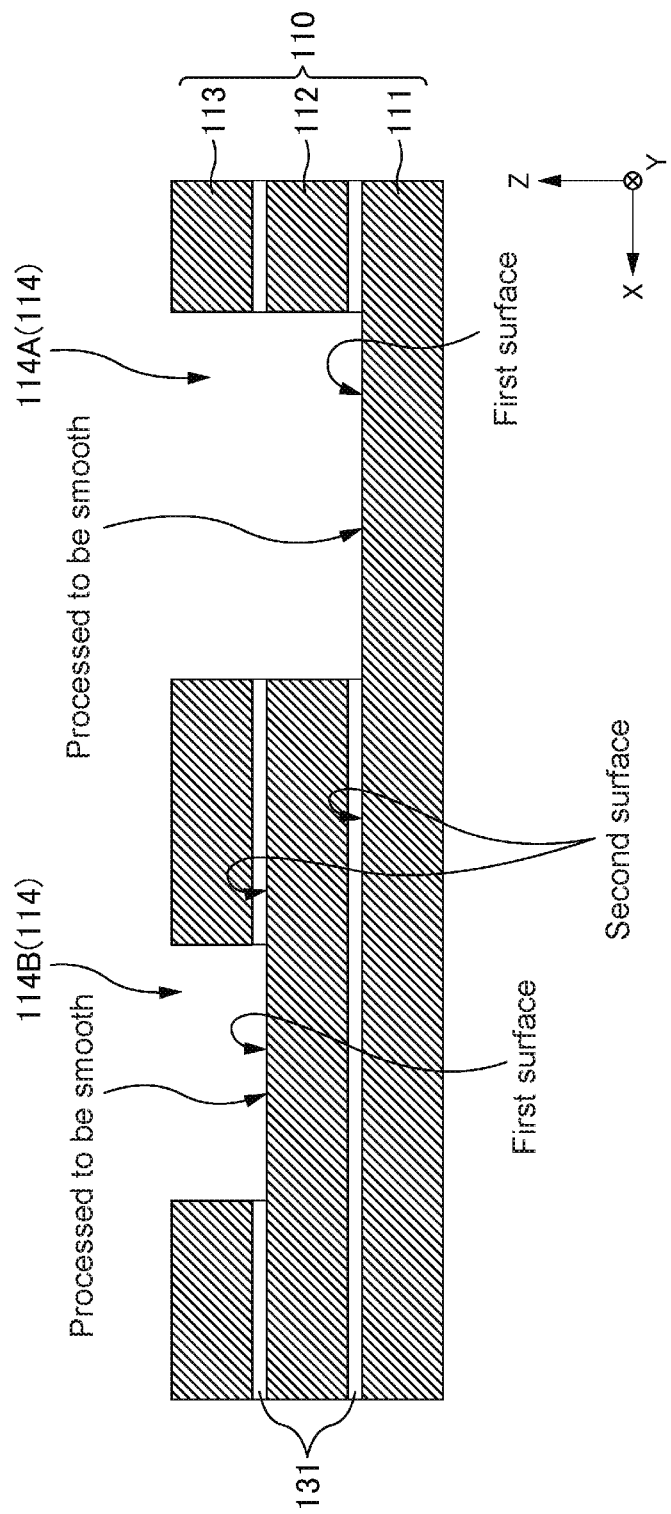
FIG. 4E is a cross-sectional view showing a step of smoothing bottom surfaces of the cavities during the manufacturing process of the semiconductor module according to Embodiment 1.

Next, as shown in FIG. 4E, the surfaces of the bottom surfaces of the first cavity 114A and the second cavity 114B are etched so that the bottom surfaces become smooth. If the bottom surfaces have surface irregularities, so-called "bleed-out", in which insulating resins and underfill applied to the bottom surface during a following step transfer to the side faces from the bottom surface via capillary action, will occur. During the present step, capillary action is suppressed by processing the bottom surface or the side faces at the periphery of the bottom surface so as to become smooth in the manner mentioned above. For example, when the cavity is formed by etching, it is possible to smooth the bottom surface if the lower metal layers are slightly over-etched. In other words, the metal layer of this bottom surface section become somewhat thinner than the other part of the metal layer. In addition, the bottom surface may be smoothed by irradiating the bottom surface using infrared light, a laser beam, an electron beam, or the like, and slightly melting the surface.

Figure 4F:
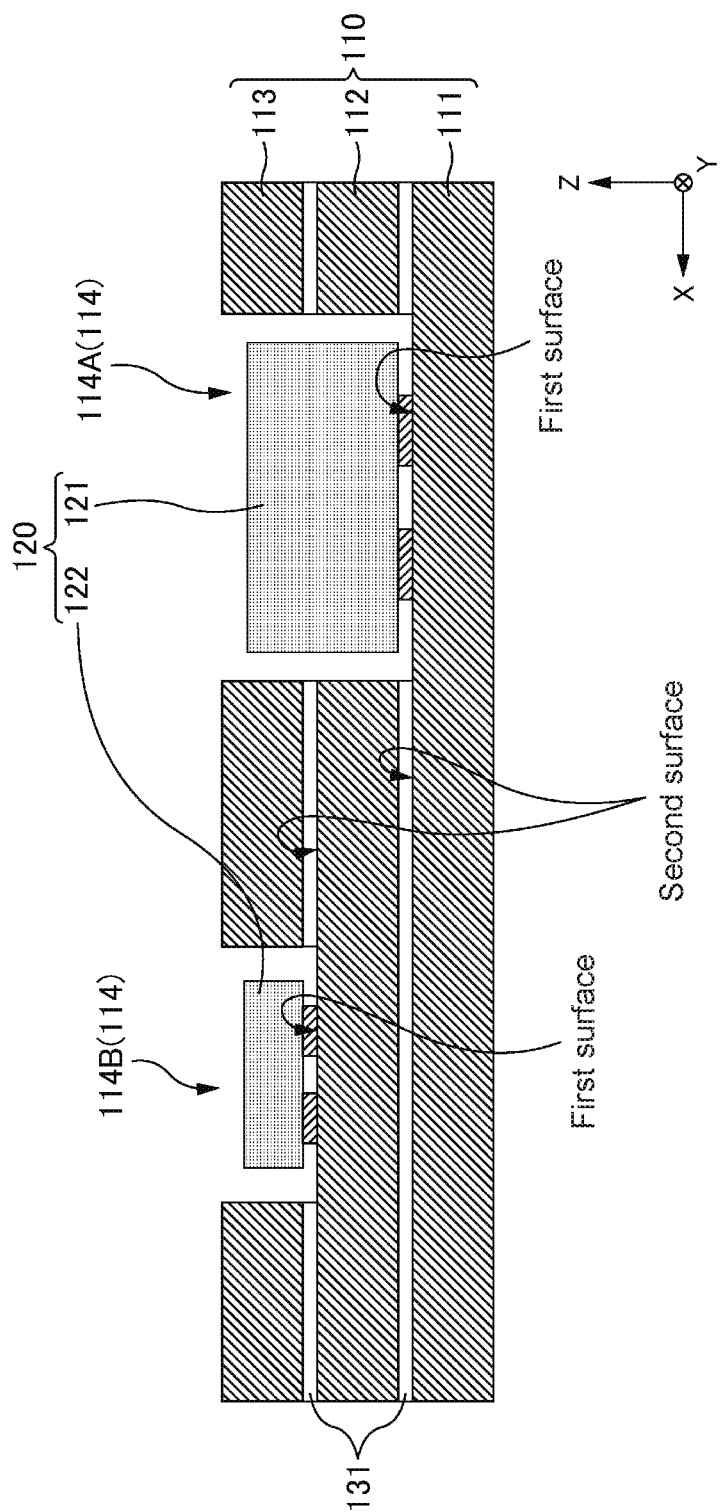
FIG. 4F is a cross-sectional view showing a step of providing internal electronic components in the cavities during the manufacturing process of the semiconductor module according to Embodiment 1.

Next, as shown in FIG. 4F, the first electronic component 121 is provided in the first cavity 114A, and the second electronic component 122 is provided in the second cavity 114B. In the case of a face up method, when respective chip rear surfaces are set as the GND (ground), the lower metal layers 111, 112 are electrically connected to the GND. In such a case, the first electronic component 121 and the second electronic component 122 are respectively electrically connected and mechanically fixed to the metal layers 111, 112 using a conductive paste or the like. Alternatively, in the case of face down method (shown in FIG. 4F), the electrodes on the surfaces of the first electronic component 121 and the second electronic component 122 are respectively electrically connected and mechanically fixed to the lower metal layers 111, 112. In such a case, in terms of the components as semiconductor elements, there are two or more electrodes, and processing has been carried out via etching on the first electronic component 121 such that the first metal layer 111 is electrically isolated in island shapes to allow a portion of the first metal layer 111 to serve as a plurality of electrodes. In addition, for the second electronic component 122, a portion of the second metal layer 112 has been processed, thereby forming electrodes (which are electrically isolated in a manner similar to the first metal layer 111). Here, the first metal layer 111 and the first electronic component 121 are electrically connected via solder or a conductive paste. Gaps between the two electronic components 121, 122 and the lower metal layers 111, 112 have an insulating resin formed using an underfill material or the like. In FIG. 4F, the respective electrodes of the first electronic component 121 are the first metal layer 111, and the respective electrodes of the second electronic component 122 are the second metal layer 112. The plurality of electrodes included in the first electronic component 121 and in the second electronic component 122 do not electrically short each other. As mentioned above, the first metal layer 111 may be processed as electrodes via etching so as to correspond to the respective electrodes of the first electronic component 121, and the second metal layer 112 may be processed as electrodes via etching so as to correspond to the respective electrodes of the second electronic component 122.

Figure 4G:
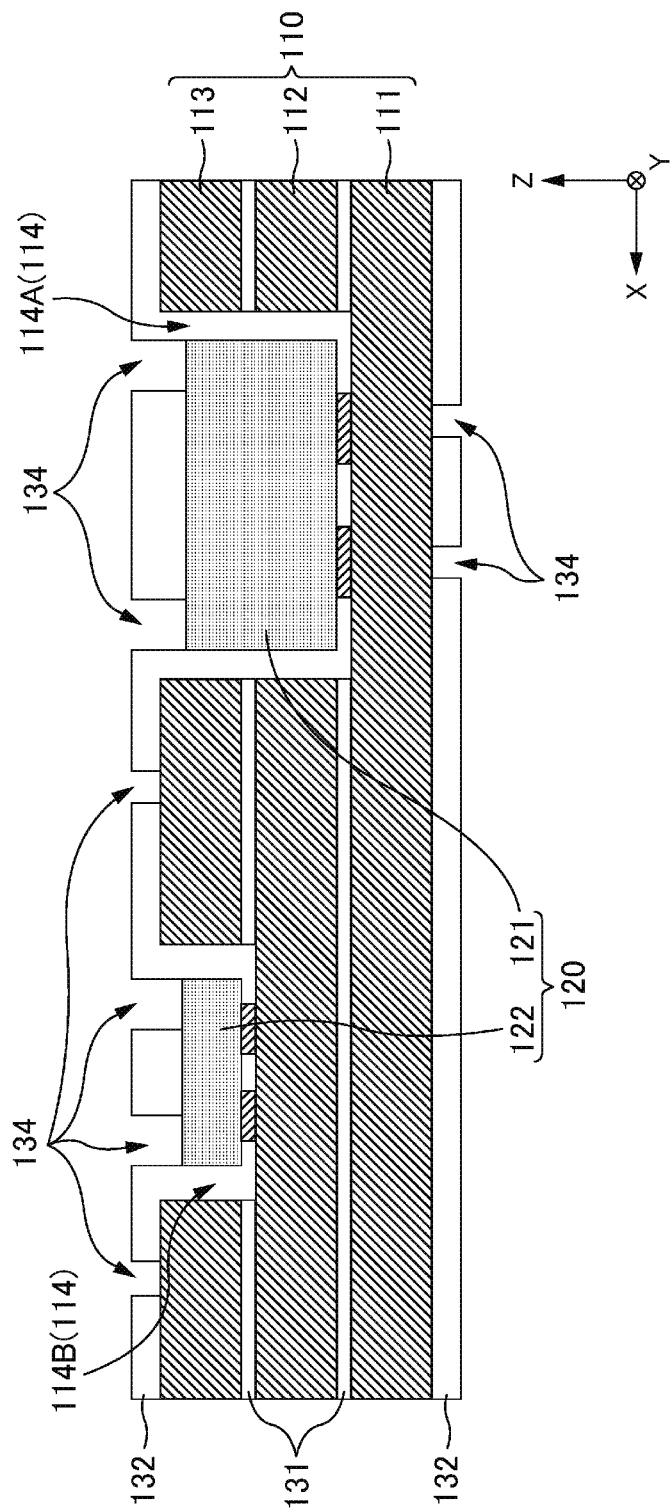
FIG. 4G is a cross-sectional view showing a step of forming second insulating layers on a metal core layer during the manufacturing process of the semiconductor module according to Embodiment 1.

Next, as shown in FIG. 4G, the periphery of the metal core layer 110 and the cavities 114 are sealed using an insulating resin. Thereafter, holes 134 for wiring are created in the second insulating layers 132 by laser processing. The holes 134 are holes that are used as vias, for example. Here, the insulating layer 132 filling the cavities 114 and the second insulating layer 132 provided on the surface of the metal core layer 110 may be different. Alternatively, the same insulating material may be used to fill the cavities 114 and form the insulating layer 132 on the surface of the metal core layer 110.

Figure 4H:
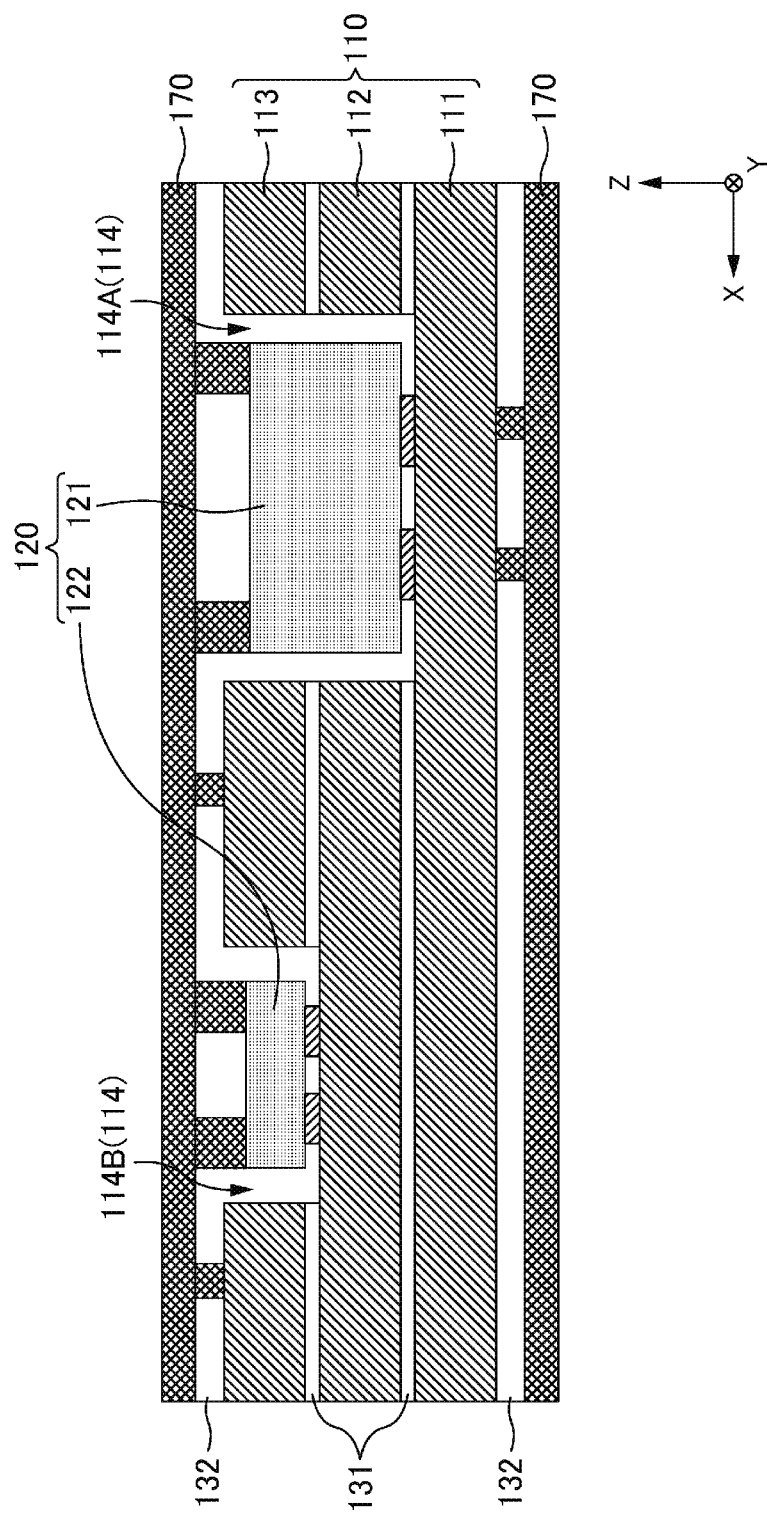
FIG. 4H is a cross-sectional view showing a step of forming metal cover layers during the manufacturing process of the semiconductor module according to Embodiment 1.
Figure 4I:
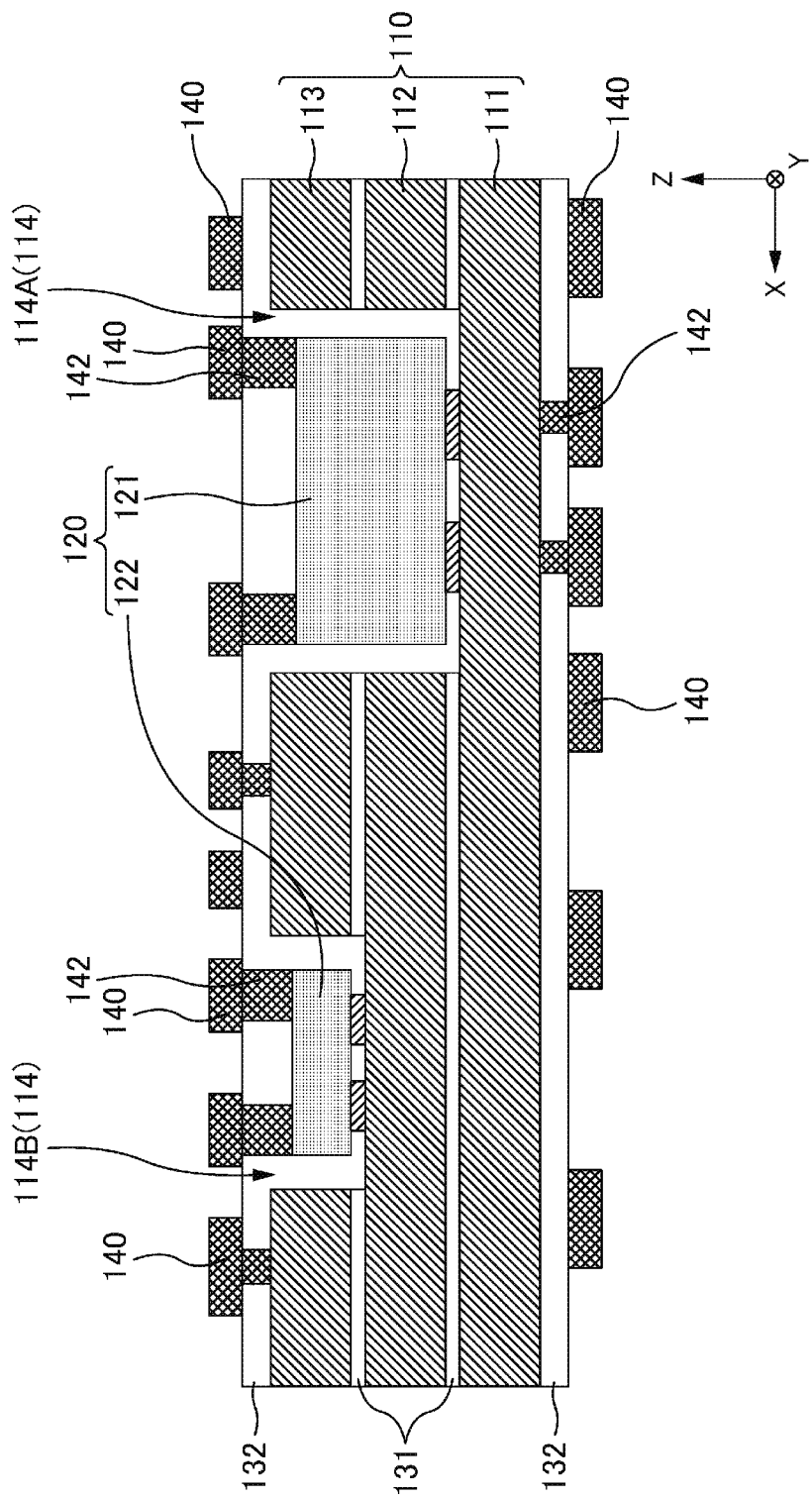
FIG. 4I is a cross-sectional view showing a step of forming a conductive pattern during the manufacturing process of the semiconductor module according to Embodiment 1.

Next, as shown in FIGS. 4H and 4I, metal cover layers 170 are formed using copper plating, and the vias 142 are formed in the holes 134. As a result, plated films are formed on the entire surface and entire rear surface of the metal core layer 110, and the conductive pattern 140 is formed thereafter via etching. Alternatively, if a plating resist is patterned to let only the necessary portions of the plating uncovered and those portions are plated, it is possible to pattern without etching. Regardless of which method is used, the conductive pattern 140 and the internal electronic components 120 are connected through the vias 142.

Figure 4J:
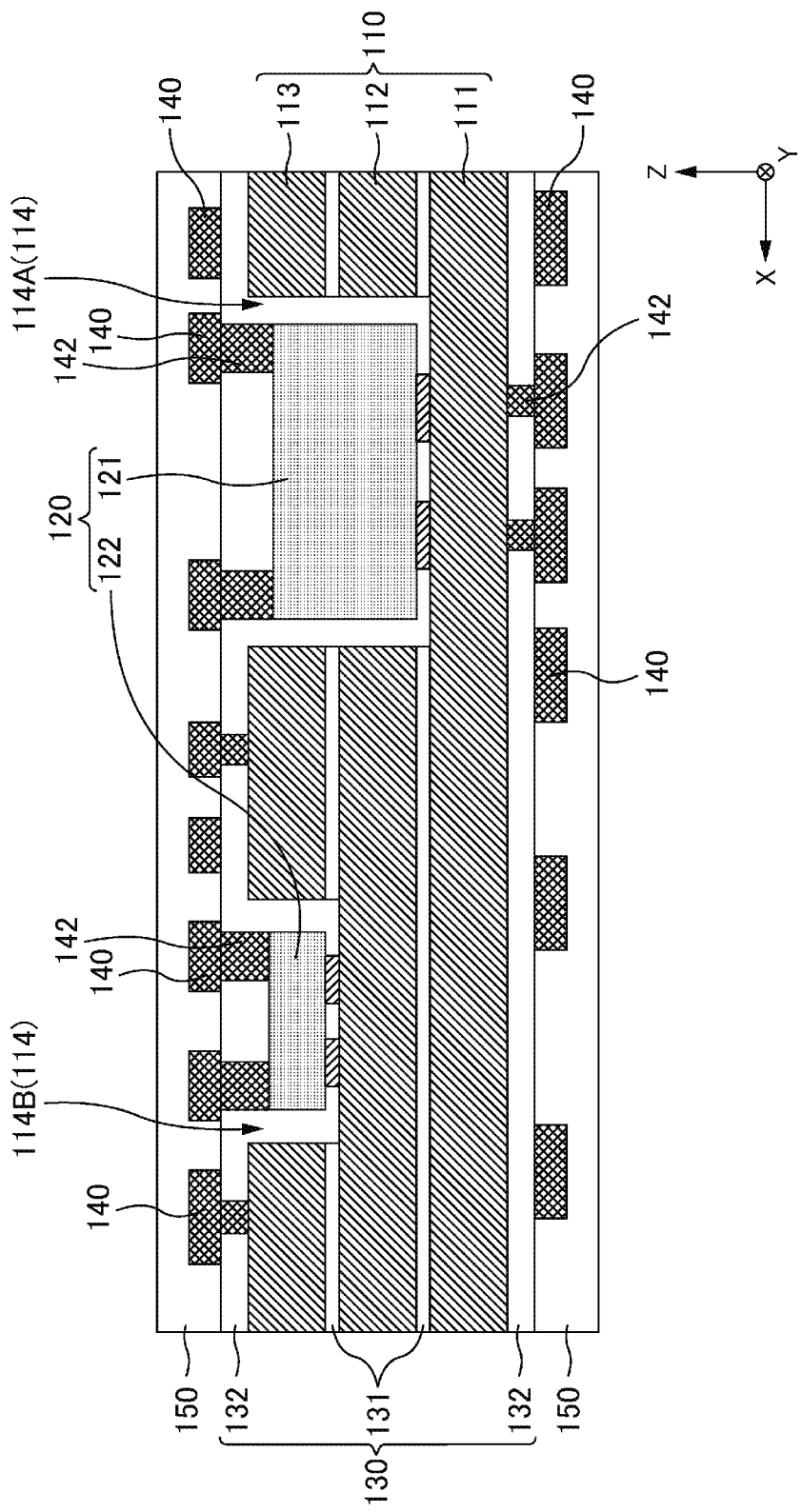
FIG. 4J is a cross-sectional view showing a step of forming third insulating layers on surfaces of the conductive pattern during the manufacturing process of the semiconductor module according to Embodiment 1.
Figure 4K:
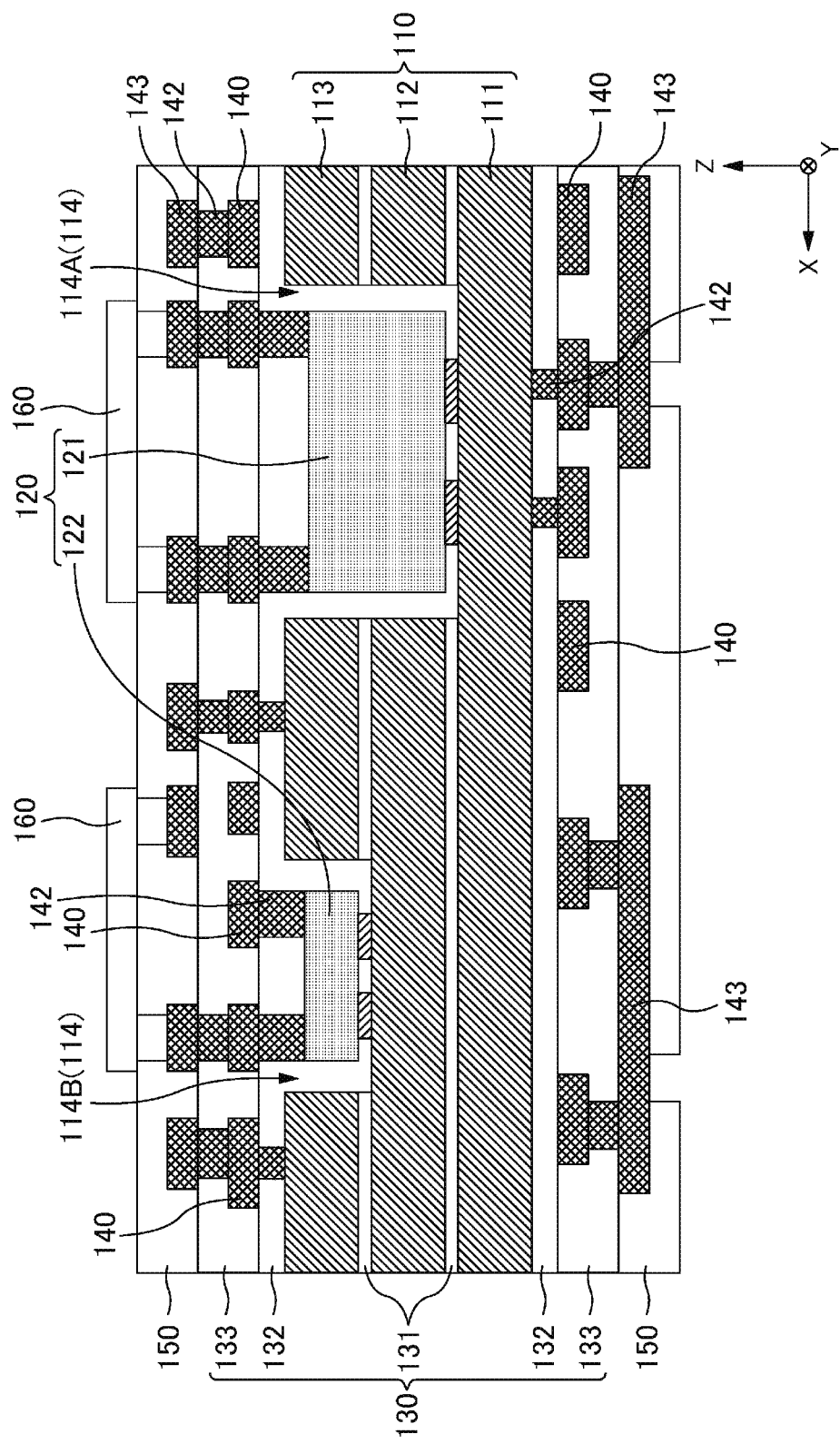
FIG. 4K is a cross-sectional view showing a step of forming vias in the third insulating layers and providing external electronic components on the third insulating layer during the manufacturing process of the semiconductor module according to Embodiment 1.

Next, as shown in FIGS. 4J and 4K, the solder resist layers 150 are formed so as to cover the conductive pattern 140, and the solder resist layers 150 are removed via etching at the portions that will be utilized as electrodes, causing these portions to be exposed as electrodes. Note that FIG. 4K illustrates a case of inserting additional interlayer insulating layer 133 and additional conductive pattern 143 for providing for more complex wiring structures as compared with FIG. 4J. As a result, it is possible to electrically connect the external electronic component 160, for example, to one side of the conductive pattern 143, and a solder ball is formed as an external terminal, for example, on the other side of the conductive pattern 143.

Embodiment 2

A semiconductor module 200 according to Embodiment 2 will be described below with reference to FIG. 5. FIG. 5 is a cross-sectional view that schematically shows a semiconductor module 200 according to Embodiment 2. Note that, other than the things described below, descriptions and reference characters in the drawings will be omitted that are same as for the already-described embodiment.

A metal core layer 210 has a plate shape in which a first metal layer 211, a second metal layer 212, and a third metal layer 213 are stacked with insulating layers 230 therebetween, for example.

The first metal layer 211 is formed thicker compared to the second metal layer 212 and the third metal layer 213. In addition, the second metal layer 212 is formed thicker compared to the third metal layer 213. In other words, for the metal layers included in the metal core layer 210, the metal layers on the +Z direction side are formed thinner than the metal layers on the −Z direction side. In still other words, the layers become thinner moving toward the top layer. As a result, in a situation where internal electronic components 220 will become increasingly thin, cavities 214 corresponding to such thin internal electronic components 220 can be formed; thus, it is possible to make the semiconductor module 200 thinner. Furthermore, since the third metal layer 213 on the +Z direction side is formed the thinnest, it is possible to form a fine conductive pattern that is even finer than the fine conductive pattern 141 in FIG. 2 on the third metal layer 213. In addition, since the first metal layer 211 is formed the thickest and it is further possible for cavities to not be formed, it is possible to increase the rigidity of the semiconductor module 200 while making the module thinner.

Furthermore, since the first metal layer 211 is made to be the thickest, it is possible to protect the semiconductor module 200 from deformation due to external forces.

Moreover, as will be described in detail later, looking at FIG. 5, the thickness of the metal layers decreases moving from the bottommost layer toward the topmost layer. In such a structure, it is possible to ensure the thickness of the bottommost layer 211, and since the number of cavities are reduced in the bottommost layer 211, with cavities being eliminated from the bottommost layer in this case; it is possible to maintain the rigidity of the module. In addition, the topmost metal layer 213 is formed the thinnest. Thus, when wiring 141B such as that in FIG. 2 is formed via etching, it is possible to suppress expansion in the lateral direction (X direction) to the extent to which the metal layer 213 is thinned; thus, a fine pattern can be formed.

Put another way, a fine pattern can be drawn on the upper metal layer; thus, it is possible to mount minute electrode elements of a small electrode size and ICs with a large number of terminals, which require a connection with the conductive pattern 140 and a crossover structure, and the like, and since the thicknesses of the lower metal layers 212, 211, particularly the bottommost metal layer 211, are thick, power element electrodes, conductive patterns, rewiring, and the like can be formed. Moreover, due to being thick, these layers function as heat sinks and are able to expand the heat-dissipating function. Furthermore, the first metal layer that is the bottommost metal layer is configured so as to not be provided with cavities, not be provided with slits, or not be provided with holes, or to not be provided with any of these. In reality, however, slits and holes are sometimes made for electrode formation and preventing adhesion or warping; thus, in the bottommost metal layer, the portion that is removed is reduced as much as possible, and it is possible to increase the rigidity of the module by making the metal ratio of the bottommost layer, when viewed in a plan view, to be higher than the metal ratio of the other upper metal layers. Therefore, it is possible to suppress warping of the substrate and to prevent increases in the stress on elements mounted via soldering or the like. In addition, when a plurality of imaging elements are mounted, the flatness of the substrate increases and optical adjustment becomes simpler.

In summary, first, the metal layers are formed thinner moving up and formed thicker moving down. Therefore, the upper layers are compatible with fine-pitch ICs or thin and fine-structured electrode chips, while the lower layers can be made so-called "power compatible" and be compatible with thick chips and large amounts of current. In particular, it is possible to process the metal layers as wiring and electrodes, and it is possible to form fine patterns at the top since the layers there are thinner. Since the metal layers become thicker moving downward, the electrodes and wiring there are better able to handle large amounts of current.

Second, the metal layer at the very bottom and the metal layer thereon function as reinforcing members for providing rigidity since these layers are thicker. In particular, it is possible to increase the rigidity of the entire semiconductor module substrate by reducing hole formation, decreasing or completely eliminating cavities, and reducing or eliminating slit formation and the like. Moreover, due to being thick, the layers at the bottom function as heat sinks and are able to expand the heat-dissipating function.

Summary

As described above, the semiconductor module 100 includes: a metal core layer 110 that including: a first metal layer 111 having a first front surface and a first rear surface opposite of the first front surface, and a second metal layer 112 that has a second front surface and a second rear surface opposite to the second front surface and is stacked on the first metal layer 111 so that the first front surface faces toward the second rear surface; a cavity 114 having a bottom surface formed of an exposed surface of the first metal layer 111 by removing the second metal layer 112, and a side face formed in the second metal layer 112 so as to be continuous with the bottom surface, at least one of the bottom surface and the side face being formed so as to be smoother than a portion of the first front surface that does not form the bottom surface; a semiconductor element 120 provided on the bottom surface of the cavity with a fixing material containing a resin component therebetween; a first conductive pattern 140 provided on an insulating layer 130 that covers the second front surface and the semiconductor element 120, the first conductive pattern 140 being electrically connected to the semiconductor element 120; and a second conductive pattern 140 provided on an insulating layer 130 that covers the first rear surface, the second conductive pattern 140 being electrically connected to the semiconductor element 120. According to this embodiment, it is possible to prevent a so-called bleed-out phenomenon of an insulating resin in the semiconductor module 100.

In addition, in the metal core layer 210 of the semiconductor module 200, the second metal layer 212 may be formed thinner than the first metal layer 211. According to this embodiment, it is possible to from a fine conductive pattern 141 on the upper metal layer, and it is possible to efficiently house the thin internal electronic components 220.

In addition, the first metal layer 111, 211 may be formed of metal material harder than the second metal layer 112, 212. According to this configuration, it is possible to suppress deformation due to external forces while keeping the semiconductor module 100, 200 thin.

In addition, the second metal layer 112 (and/or the third metal layer 113) may have a third conductive pattern 141 that is electrically connected to at least one of the semiconductor element and the first conductive pattern 140. According to this configuration, it is possible to provide multi-use wiring by forming a fine conductive pattern 141 in the second metal layer 112 (and/or in the third metal layer 113).

In addition, the second metal layer 112 (and/or the third metal layer 113) may include a first metal section 141A and a second metal section 141B that is isolated from the first metal section 141A, and the third conductive pattern 141 is either the first metal section 141A or the second metal section 141B. According to this embodiment, an island-shaped wiring pattern or the like is formed; thus it is possible to provide multi-use wiring.

In addition, the first front surface (second surface) of the first metal layer 111 (second metal layer 112) that forms the bottom surface of the cavity 114 may be connected to the internal electronic components 120 (semiconductor elements) such that the heat of the internal electronic components 120 (semiconductor elements) is transferred. According to this configuration, it is possible to efficiently dissipate the heat of the internal electronic components 120 that generate heat.

Embodiments of the present invention were described above, but the present invention is not limited thereto. The material, shape, and placement of the various above-described members are merely embodiments for implementing the present invention, and various modifications can be made as long as these modifications do not depart from the spirit of the invention. In particular, it is explicitly contemplated that any part or whole of any two or more of the embodiments and their modifications described above can be combined and regarded within the scope of the present invention.

What is claimed is:

1. A circuit board, comprising:
a core layer including a plurality of metal layers laminated one over another, a bottommost metal layer of the plurality of metal layers being thickest among the plurality of metal layers, and a topmost metal layer of the plurality of metal layer being thinnest among the plurality of metal layers;
an upper insulating layer and an upper conductive pattern provided over a top surface of the core layer; and
a lower insulating layer and a lower conductive pattern provided below a bottom surface of the core layer,
wherein the topmost metal layer of the core metal layer is patterned to have a prescribed shaped section that serves as wiring and that is connected to the upper conductive pattern,
wherein a metal ratio that is defined as a ratio of an area that is formed of metal relative to an entire area in a plan view is higher in the bottommost metal layer than in the topmost metal layer.

2. A semiconductor module, comprising:
the circuit board according to claim 1, wherein the core layer has a cavity by removing a portion of at least the topmost metal layer, thereby exposing a surface of one of the plurality of metal layers that is lower than the topmost metal layer as a bottom surface of the cavity; and
a semiconductor element mounted in the cavity,
wherein the bottommost metal layer of the core metal layer is patterned to have a prescribed shaped section that serves as wiring and that is connected to the lower conductive pattern and to the semiconductor element.

3. The semiconductor module according to claim 2, wherein each of the topmost metal layer and the bottommost metal layer includes one of Cu, Al, and Fe as a primary material.

* * * * *